United States Patent
Tang

(10) Patent No.: US 6,597,897 B2
(45) Date of Patent: *Jul. 22, 2003

(54) LOW POWER RADIO FREQUENCY TRANSMITTER WITH CONTROLLABLE GAIN

(75) Inventor: Qingfeng Tang, Farmington Hills, MI (US)

(73) Assignee: Lear Automotive Dearborn, Inc., Southfield, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,095

(22) Filed: Dec. 14, 1998

(65) Prior Publication Data

US 2002/0028663 A1 Mar. 7, 2002

(51) Int. Cl.$^7$ .............................. H04B 1/034; H04B 1/02
(52) U.S. Cl. ........................... 455/95; 455/127; 455/91; 455/574; 340/5.72; 330/278
(58) Field of Search .................. 455/115, 126, 455/127, 91, 99, 95, 345, 352, 343, 574; 330/278, 285, 281; 340/825.69, 825.72, 5.71, 5.72, 5.64

(56) References Cited

U.S. PATENT DOCUMENTS

| | | | |
|---|---|---|---|
| 4,660,002 A | * | 4/1987 | Iijima et al. ................. 455/113 |
| 5,214,372 A | * | 5/1993 | Vaisanen et al. .............. 324/95 |
| 5,404,584 A | * | 4/1995 | Bobbitt et al. .............. 455/115 |
| 5,838,257 A | * | 11/1998 | Lambropoulos ............ 455/574 |
| 6,018,646 A | * | 1/2000 | Myllymaki et al. .......... 455/115 |
| 6,181,254 B1 | * | 1/2001 | Vogele ........................ 455/92 |

* cited by examiner

*Primary Examiner*—Nguyen T. Vo
*Assistant Examiner*—Eliseo Ramos-Feliciano
(74) *Attorney, Agent, or Firm*—MacMillan, Sobanski & Todd, LLC

(57) ABSTRACT

A low power transmitter useful for vehicle remote keyless entry systems, for example, includes a transmitter circuit portion and a gain control circuit portion. The gain control circuit portion preferably includes an inductive load that introduces a resonant frequency that provides radio frequency gain control. The transmitter circuit portion preferably includes a transistor having a collector node and an emitter node. The gain controller circuit preferably includes a capacitive load coupled between the emitter node and the collector node of the transistor. The inductive load preferably is coupled between the emitter node of the transistor and ground.

17 Claims, 2 Drawing Sheets

LOW POWER RADIO FREQUENCY TRANSMITTER WITH CONTROLLABLE GAIN

BACKGROUND OF THE INVENTION

This invention generally relates to remote transmitters, such as those used in remote keyless entry systems. More specifically, this invention relates to a remote transmitter having a gain control feature that allows the transmitter to operate at a low power level.

A variety of vehicle security systems are currently available. Typical systems include a remote transmitter that is housed within a key fob so that it can be easily carried about by an individual. With the increasing popularity of such remote transmitters, a variety of difficulties have been presented.

One difficulty to be overcome is the requirement in some parts of the world that remote transmitters operate at relatively low power levels. As one attempts to compensate for lower power levels, other difficulties such as managing gain and harmonics levels are introduced. Additionally, it has proven difficult to make low-power transmitters economically enough to be suitable for mass production. Other difficulties introduced by power level restrictions include maintaining stable performance within a wide temperature range.

This invention addresses the needs that have not been previously met by providing a remote transmitter that generates radio frequency communication signals such as those used in a remote keyless entry system while operating at a relatively low power level.

SUMMARY OF THE INVENTION

In general terms this invention is a remote transmitter for use in remote keyless entry systems, for example. The remote transmitter of this invention includes a signal transmitter circuit portion that has an input for receiving data to incorporate into a signal. The signal transmitter circuit portion also includes an output for transmitting a radio frequency signal to a remote receiver. A gain control circuit is coupled with the output of the signal transmitter portion. The gain control circuit includes an inductive load that introduces a frequency that controls gain associated with the signal transmitter portion when generating the transmitted signal. The characteristics of the inductive load are chosen based upon the needs of a particular situation and the characteristics of the components of the signal transmitter circuit portion.

In the preferred embodiment, the signal transmitter portion includes a transistor having a base node, a collector node and an emitter node. The gain control circuit includes a capacitive load coupled between the collector node and the emitter node of the transistor. The inductive load preferably is coupled between the emitter node and ground.

The various features and advantages of this invention will become apparent to those skilled in the art from the following detailed description of the currently preferred embodiments. The drawings that accompany the detailed description can be briefly described as follows.

DETAILED DESCRIPTION OF THE PREFERRED EMBODIMENTS

Figure 1:
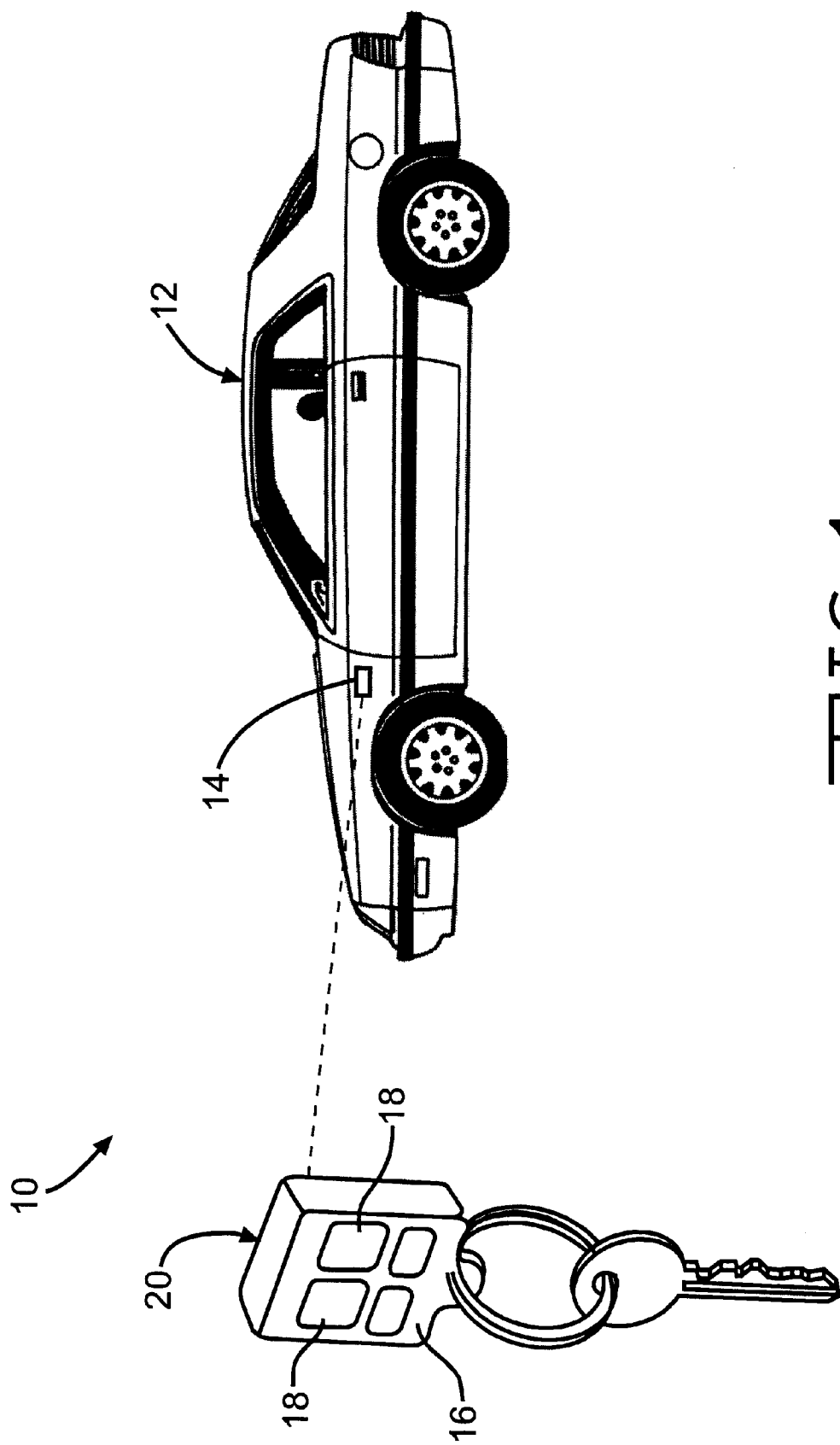
FIG. 1 diagrammatically illustrates the use of a low power transmitter designed according to this invention with a vehicle remote keyless entry system.

FIG. 1 diagrammatically illustrates a vehicle remote keyless entry system, which is one example of the kind of system for which the inventive low power transmitter is useful. The vehicle 12 includes a controller 14 to control, for example, the locking and unlocking of the vehicle door locks and trunk. A key fob 16 includes a plurality of switches 18, which are selectively activated to cause the controller 14 to bring about a desired result. The operation of the controller 14 is known to those skilled in the art.

Figure 2:
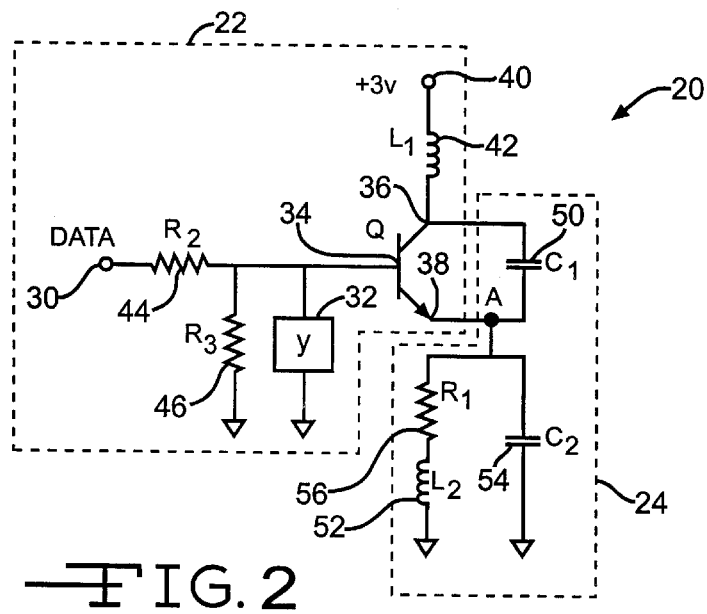
FIG. 2 schematically illustrates a low power transmitter designed according to this invention.

The key fob 16 houses a low power transmitter 20, which preferably generates radio frequency signals that are received and interpreted by the controller 14 to bring about a desired result. FIG. 2 schematically illustrates the preferred embodiment of the low power transmitter 20. For purposes of discussion, the low power transmitter 20 has been divided into a transmitter circuit portion 22 and a gain control circuit portion 24.

The transmitter circuit portion 22 preferably includes an input 30 for receiving data to incorporate into a transmitted signal. The data, which typically includes a command to the controller 14, is generated depending on which of the switches 18 is activated by the user as is known in the art. An oscillator device 32 is included for generating the transmitted signal. The oscillator device 32 preferably is a capacitor or an SAW device or a crystal device. A transistor Q is included and functions as an amplifier of the transmitted signal. The transistor Q includes a base node 34, a collector node 36 and an emitter node 38. A voltage source 40, an inductor 42 and a set of resistors 44 and 46 are included to complete the transmitter circuit portion 22. The operation of a transmitter circuit portion such as that illustrated at 22 is known within the art and, therefore, need not be further described in the specification.

The gain control circuit portion 24 controls the radio frequency gain associated with the transmitter circuit portion 22. The gain control circuit portion 24 preferably includes an LC or RC network to control the radio frequency gain and harmonic components of the transmitter circuit portion 22. It is a frequency selectable network that provides feedback and gain control.

In the embodiment illustrated in FIG. 2, the gain control circuit portion 24 includes a capacitive load 50 coupled across the collector node 36 and the emitter node 38 of the transistor Q. The capacitive load 50, when coupled as illustrated, provides a controllable feedback between the emitter and collector nodes of the transistor. An inductive load 52 is coupled between the emitter node 38 and ground as illustrated. A second capacitive load 54 and a resistive load 56 preferably are also coupled between the emitter node 38 and ground. The particular components selected to realize the inductive load 52, the second capacitive load 54 and the resistive load 56 can be selected from commercially available components depending on the specific needs of a particular situation.

Given this description, those skilled in the art will be able to choose from among commercially available components to realize the gain control circuit portion 24 depending on the requirements of a particular application. For example, depending on the components of the transmitter circuit portion 22, the characteristics of the inductive load 52 preferably is chosen to introduce a resonant frequency that effectively increases the resistance between the emitter node 38 and ground. Such an arrangement controls the feedback for the transistor Q and reduces the power at the resonant frequency. In other words, the embodiment of FIG. 2 compresses the power at the resonant frequency.

The embodiment of FIG. 2 is one example of a gain control circuit portion 24 designed according to this invention. FIGS. 3 through 8 schematically illustrate alternative embodiments, respectively. Depending on the desires of a designer and the needs of a particular application, one skilled in the art will be able to choose when to substitute one of the embodiments of FIGS. 3 through 8 for the portion of the embodiment of FIG. 2 illustrated between the node A and ground. Given this description, those skilled in the art will be able to choose from among the various embodiments that are disclosed and will be able to choose appropriate components providing the necessary values to accomplish a desired result.

Figure 3:
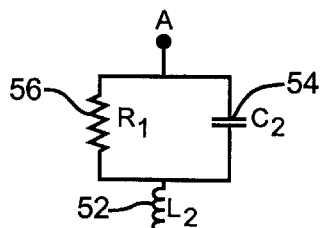
FIG. 3 schematically illustrates an alternative embodiment of selected portions of the embodiment of FIG. 2.
Figure 4:
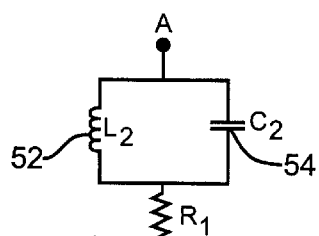
FIG. 4 schematically illustrates another alternative embodiment of selected portions of the embodiment of FIG. 2.
Figure 5:
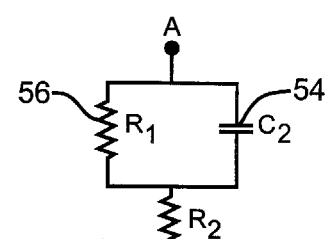
FIG. 5 schematically illustrates another alternative embodiment of selected portions of the embodiment of FIG. 2.
Figure 6:
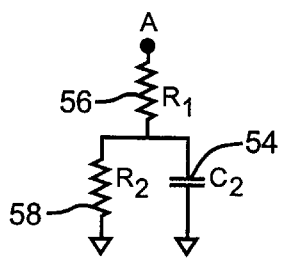
FIG. 6 schematically illustrates another alternative embodiment of selected portions of the embodiment of FIG. 2.
Figure 7:
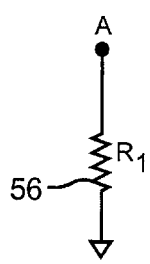
FIG. 7 schematically illustrates another alternative embodiment of selected portions of the embodiment of FIG. 2.
Figure 8:
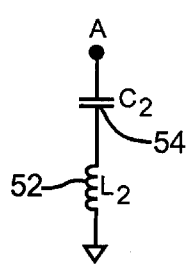
FIG. 8 schematically illustrates another alternative embodiment of selected portions of the embodiment of FIG. 2.

For example, when it is desirable to increase the power at the resonant frequency, the embodiment of FIG. 3 would be preferable to the embodiment of FIG. 2 because the FIG. 3 arrangement of the inductive load 52, the second capacitive load 54 and the resistive load 56 provides a lower impedance, which results in an increased power at the resonant frequency. As another example, the embodiment of FIG. 7 is preferable for controlling certain harmonics. In one example, the characteristics of the second capacitive load 54 and the inductive load 52 are selected so that $1/\sqrt{L_2 C_2}=$ 630 MHz.

Other variations may become apparent to those skilled in the art, given this description for realizing a frequency selectable network to control the feedback and gain associated with the transmitter circuit portion 22. A transmitter designed according to this invention is capable of operating at relatively low power levels, gives very stable temperature performance and is economical to manufacture.

The description just given is intended to provide example implementations of this invention. Variations and modifications may become apparent to those skilled in the art that do not depart from the purview and spirit of this invention. The scope of legal protection given to this invention can only be determined by studying the following claims.

What is claimed is:

1. A low power remote transmitter for use in a vehicle remote keyless entry system comprising:
    a signal transmitter circuit portion including an input for receiving data to be incorporated into a radio frequency signal and an output for transmitting said radio frequency signal to a remote receiver of the entry system, said output including a transistor having a base node, a collector node and an emitter node, said signal transmitter circuit portion further including an oscillator connected to said base node, said oscillator being for generating a radio frequency signal to be transmitted;
    an inductor having a first end and a second end, said inductor first end connected to said collector node of said transistor;
    a power supply connected to said second end of said inductor, said inductor being operative as an antenna to radiate said radio frequency signal; and
    a gain control circuit for controlling a gain associated with said signal transmitter circuit portion so as to reduce power consumed by said remote transmitter, said gain control circuit being connected to said transistor emitter and collector nodes and including an inductive load that introduces a resonant frequency that controls the gain associated with said signal transmitter circuit portion by controlling power at the resonant frequency when generating the radio frequency signal to be transmitted.

2. The transmitter of claim 1, wherein said gain control circuit includes a capacitive load connected across said collector and emitter nodes.

3. The transmitter of claim 2, wherein said gain control circuit inductive load is coupled between said emitter node and ground.

4. The transmitter of claim 3, wherein said capacitive load connected across said collector and emitter nodes is a first capacitive load and further wherein said gain control circuit includes a second capacitive load and a resistive load, said second capacitive load and said resistive load being coupled between said emitter node and ground.

5. The transmitter of claim 4, wherein said gain control circuit inductive load is in parallel with said second capacitive load and the parallel combination of said inductive load and said second capacitive load is in series with said resistive load.

6. The transmitter of claim 4, wherein said gain control circuit inductive load is in series with said second capacitive load and said resistive load is connected across said second capacitive load to form a parallel combination therewith.

7. The transmitter of claim 3 wherein said capacitive load connected across said collector and emitter nodes is a first capacitive load and further wherein said gain control circuit includes said inductive load connected in series to only a second capacitive load, said inductive and second capacitive loads cooperating to form a resonant circuit.

8. A low power remote transmitter for use in a security system that includes radio frequency signal communications, the transmitter comprising:
    a signal transmitter circuit portion having an input for receiving data to be incorporated into a radio frequency signal and an output for transmitting the radio frequency signal including a transistor having a base node, a collector node and an emitter node with said collector node connected through an inductor to a power supply, said inductor operative as an antenna to radiate said radio frequency signal, said output portion further including an oscillator connected to said transistor base node, said oscillator being operative to generate the radio frequency signal to be transmitted; and
    a gain control circuit for controlling a gain associated with the signal transmitter circuit portion so as to reduce a power consumed by said remote transmitter, said gain control circuit including a feedback capacitor connected between said transistor collector and emitter nodes and a resonant circuit connected between said emitter node and ground such that said gain control circuit modifies the gain associated with the signal transmitter circuit portion by controlling power at a resonant frequency associated with the gain.

9. The transmitter of claim 8, wherein said resonant circuit includes an inductive load, a second capacitive load, and a resistive load connected between said transistor emitter node and ground.

10. The transmitter of claim 9, wherein said resonant circuit inductive load is in parallel with said second capacitive load and the parallel combination of said inductive load and said second capacitive load is in series with said resistive load.

11. The transmitter of claim 9, wherein said resonant circuit inductive load is in series with the second capacitive load and said resistive load is connected across said second capacitive load to form a parallel combination therewith.

12. The transmitter of claim 8 wherein said resonant circuit includes an inductive load connected in series to only a capacitive load, said inductive and capacitive loads cooperating to form said resonant circuit.

13. A low power remote transmitter for use in a vehicle keyless entry system that includes radio frequency signal communications, the transmitter comprising:

a signal transmitter circuit portion having an input for receiving data to be incorporated into a radio frequency signal and an output for transmitting the radio frequency signal including a transistor having a base node, a collector node and an emitter node with said collector node connected through an inductor to a power supply, said inductor operative as an antenna to radiate said radio frequency signal, said output portion further including an oscillator connected to said transistor base node, said oscillator being operative to generate the radio frequency signal to be transmitted; and a gain control circuit for controlling a gain associated with the signal transmitter circuit portion so as to reduce a power consumed by said remote transmitter, said gain control circuit including a feedback capacitor connected between said collector and emitter nodes and a resonant circuit connected between said emitter node and ground such that said gain control circuit modifies the gain associated with the signal transmitter circuit portion by controlling power at a resonant frequency associated with the gain.

14. The transmitter of claim 13, wherein said resonant circuit includes an inductive load, a second capacitive load, and a resistive load connected between said transistor emitter node and ground.

15. The transmitter of claim 13, wherein said resonant circuit inductive load is in parallel with said second capacitive load and the parallel combination of said inductive load and said second capacitive load is in series with said resistive load.

16. The transmitter of claim 13, wherein said resonant circuit inductive load is in series with the second capacitive load and said resistive load is connected across said second capacitive load to form a parallel combination therewith.

17. The transmitter of claim 13 wherein said resonant circuit includes an inductive load connected in series to only a capacitive load, said inductive and capacitive loads cooperating to form said resonant circuit.

* * * * *